(12) United States Patent
Bouche

(10) Patent No.: US 11,876,366 B2
(45) Date of Patent: Jan. 16, 2024

(54) OVERVOLTAGE PROTECTION

(71) Applicant: STMicroelectronics (Alps) SAS, Grenoble (FR)

(72) Inventor: Michel Bouche, Grenoble (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 18/062,980

(22) Filed: Dec. 7, 2022

(65) Prior Publication Data

US 2023/0098647 A1  Mar. 30, 2023

Related U.S. Application Data

(63) Continuation of application No. 17/157,555, filed on Jan. 25, 2021, now Pat. No. 11,552,467.

(30) Foreign Application Priority Data

Jan. 27, 2020 (FR) ...................................... 2000762

(51) Int. Cl.
*H02H 3/20* (2006.01)
*H02H 3/02* (2006.01)
*H02H 3/033* (2006.01)

(52) U.S. Cl.
CPC ............ *H02H 3/202* (2013.01); *H02H 3/021* (2013.01); *H02H 3/033* (2013.01); *H02H 3/20* (2013.01)

(58) Field of Classification Search
CPC ............ H02H 3/20; H02H 3/02; H02H 3/033; H02H 3/021; H02H 3/22; H02H 9/046; H02H 9/04; H02H 1/063; H02H 3/202; H01L 27/0255; H01L 27/0266; H03K 17/007; H03K 2217/0054; H03K 17/08122
USPC .......................................... 361/56, 91.1, 111
See application file for complete search history.

(56) References Cited

U.S. PATENT DOCUMENTS

| | | | |
|---|---|---|---|
| 6,724,592 B1 | 4/2004 | Tong et al. | |
| 6,757,147 B1 | 6/2004 | Tong et al. | |
| 8,643,988 B1 | 2/2014 | Kwong | |
| 10,978,444 B2 | 4/2021 | de Raad | |
| 2004/0223273 A1 | 11/2004 | Austin et al. | |
| 2008/0088494 A1* | 4/2008 | Lee ..................... | H03K 17/063 361/91.1 |
| 2008/0316660 A1 | 12/2008 | Huang et al. | |
| 2009/0201615 A1 | 8/2009 | Bernard et al. | |
| 2015/0092308 A1 | 4/2015 | P et al. | |
| 2017/0155244 A1 | 6/2017 | Dickey et al. | |
| 2018/0152019 A1 | 5/2018 | Rajagopal et al. | |
| 2018/0159323 A1 | 6/2018 | Huang et al. | |
| 2018/0337170 A1* | 11/2018 | Kanawati ................. | H04B 1/18 |

* cited by examiner

*Primary Examiner* — Danny Nguyen
(74) *Attorney, Agent, or Firm* — Slater Matsil, LLP

(57) ABSTRACT

An embodiment of the present disclosure relates to an electronic circuit including a first switch coupling a first node of the circuit to an input/output terminal of the circuit; a second switch coupling the first node to a second node of application of a fixed potential; and a high-pass filter having an input coupled to the terminal and an output coupled to a control terminal of the second switch.

20 Claims, 2 Drawing Sheets

OVERVOLTAGE PROTECTION

CROSS-REFERENCE TO RELATED APPLICATIONS

This application is a continuation of U.S. patent application Ser. No. 17/157,555, filed Jan. 25, 2021, which application claims the benefit of French Application No. 2000762, filed on Jan. 27, 2020, which applications are hereby incorporated herein by reference.

TECHNICAL FIELD

The present disclosure generally relates to electronic devices and methods, and in particular electronics circuits such as integrated circuits and associated methods.

BACKGROUND

An electronic circuit typically has input/output terminals, intended to connect the electronic circuit to other electronic circuits.

SUMMARY

There is a need to protect an electronic circuit against overvoltages occurring on terminals of the circuit.

There is a need to both test the operation of analog portions of an electronic circuit and to protect the circuit against overvoltages.

An embodiment overcomes all or part of the disadvantages of known electronic circuits comprising an overvoltage protection device.

An embodiment overcomes all or part of the disadvantages of known overvoltage protection methods.

An embodiment provides an electronic circuit, comprising a first switch coupling a first node of the circuit to an input/output terminal of the circuit; a second switch coupling the first node to a second node of application of a fixed potential; and a high-pass filter having an input coupled to the terminal and an output coupled to a control terminal of the second switch.

According to an embodiment, the input of the high-pass filter is coupled to the input/output terminal by a diode, the diode preferably having its anode facing the input/output terminal.

According to an embodiment, the input of the high-pass filter is coupled to another input/output terminal; and, preferably, the other input/output terminal is coupled to the second node by a circuit of protection against electrostatic discharges, more preferably a component having a Zener diode function.

According to an embodiment, the high-pass filter has a cutoff frequency capable of setting the second switch to the on state for at least one time period modeled according to an overvoltage model, the time period being preferably an electrostatic discharge period modeled according to a human body model.

According to an embodiment, the circuit further comprises at least one third switch coupling at least a third node of the circuit to the input/output terminal; and, preferably, at least one fourth switch coupling the at least one third node to the second node, the output of the high-pass filter being further coupled to at least one control terminal of the at least one fourth switch.

According to an embodiment, the circuit comprises a control circuit coupled to control terminals of the first switch and of the at least one third switch, configured so that the first switch and the at least one third switch form branches of a multiplexer together.

According to an embodiment, the circuit further comprises an additional switch coupling the second node to the input/output terminal, the output of the high-pass filter being coupled to a control terminal of the additional switch.

According to an embodiment, the circuit further comprises a diode coupling the second node to the input/output terminal and preferably having its cathode facing the input/output terminal.

According to an embodiment, the circuit comprises a first transistor having a conduction terminal coupled to the second node, and a control terminal or another conduction terminal coupled to the first node; and, preferably, at least one second transistor having a gate thickness greater than a gate thickness of the first transistor.

According to an embodiment, the first switch comprises a two-way pass gate.

According to an embodiment, the first node is a node of application of an analog signal.

According to an embodiment, the high-pass filter is passive.

An embodiment provides a method of protecting a circuit such as defined hereabove.

According to an embodiment, the method comprises the reception of the overvoltage by the high-pass filter, the reception causing the setting to the on state of the second switch, preferably in the absence of a power supply voltage of the circuit.

An embodiment provides a method of testing a circuit such as defined hereabove, the method preferably comprising the application and/or the reception of a signal on the input/output terminal.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, portions of electronic circuits are not described in detail, the described embodiments being compatible with such usual portions of electronic circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to a . . . in a normal position of use.

Unless specified otherwise, the expressions "around", "approximately", "substantially" and "in the order of" signify within 10%, and preferably within 5%.

Unless specified otherwise, ordinal numerals such as "first", "second", etc. are only used to distinguish elements from one another. In particular, these adjectives do not limit the described devices and methods to a specific order of these elements.

Figure 1:
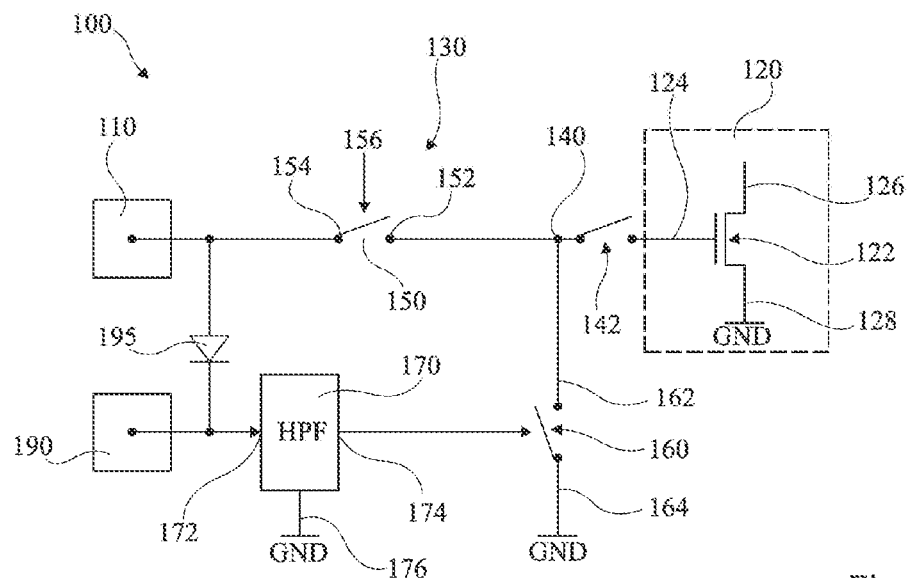
FIG. 1 partially and schematically shows an embodiment of an electronic circuit.

FIG. 1 partially and schematically shows an embodiment of an electronic circuit 100. Electronic circuit 100 has an input/output terminal 110 and, preferably, other input/output terminals, not shown.

Electronic circuit 100 may comprise one or a plurality of electronic chips. Such a chip is defined by a substrate such as a semiconductor wafer portion and electronic circuits located inside of and on the substrate. Circuit 100 may be formed by an electronic chip. In this case, the input/output terminals of circuit 100 are defined by the conductive connection tracks located on the chip.

The electronic chip(s) may be located in one or a plurality of integrated circuits. Thus, electronic circuit 100 may comprise or be formed by an integrated circuit. The term integrated circuit designates the assembly of a package and of one or a plurality of chips located in the package. The package comprises electrically-conductive connection areas located at the surface of the package or electrically-conductive pins coming out of the package. In the case where electronic circuit 100 is an integrated circuit, the input/output terminals of circuit 100 may be defined by the connection pins or areas of the package.

As an example, electronic circuit 100 is a time-of-flight ToF measurement circuit, or an image sensor or, for example, a circuit dedicated to delivering power supply voltages.

Electronic circuit 100 comprises a portion 120 and a device 130 coupling input/output terminal 110 to the portion 120 of circuit 100. Portion 120 carries out one of or a plurality of the usual functions of an electronic circuit, such as, for example, the generation of one or a plurality of DC voltages, the generation of an oscillating signal, and/or, still as an example, functions of analog-to-digital and/or digital-to-analog conversion. For this purpose, portion 120 typically comprises one or a plurality of transistors 122.

In an example of transistor 122, the transistor has a control terminal 124 (that is, in the case of a field-effect transistor, a gate terminal) coupled, preferably connected, to device 130. Transistor 122 has conduction terminals 126 and 128. The term conduction terminals of a transistor or of a switch designates terminals of the transistor or of the switch that the transistor or switch electrically connects together in a conductive state and isolates from each other in a non-conductive state. In the shown example, conduction terminal 126, typically a drain terminal, is coupled to elements, not shown, of the portion 120 of circuit 100.

Preferably, transistor 122 has one of its conduction terminals (terminal 128 in the shown example), typically a source terminal, coupled, more preferably connected, to a node of application of a fixed potential GND. Node GND is preferably formed by the ground. The fixed potential then is the ground potential, and this potential is used as a reference. Node GND may, as a variation, be formed by any node or terminal, for example, an input/output terminal, with a potential having a constant interval relative to the ground potential. Such a potential may then be regulated, for example, supplied by a power supply.

Circuit 100 further comprises a node 140 coupled, for example, by a switch 142, to the portion 120 of circuit 100. Switch 142 may comprise one or a plurality of transistors in series. Switch 142 may be omitted, and node 140 is then preferably connected to portion 120.

Node 140 is a node of application of a signal originating from and/or sent to portion 120. In the shown example, node 140 is coupled (by optional switch 142) to the gate of transistor 122 and, thereby, the signal applied to node 140 is sent to portion 120. In another example, not shown in FIG. 1, node 140 is coupled, for example by a switch, or is connected, to conduction terminal 126, and control terminal 124 is coupled to other elements of portion 120 of circuit 100. In this other example, the signal applied to node 140 then originates from portion 120. In normal operation, that is, in operation and in the absence of an overvoltage, the voltage between nodes 140 and GND is located within a range. As an example, for this voltage, the normal operating range extends from 0 to 4.0 V, preferably from 0 to 1.7 V.

Preferably, the signal applied to node 140 has a positive potential, that is, greater than that of node GND. Transistor 122 is then more preferably of N-channel type. This is not limiting, and the signs of the potential differences, that is, of the voltages, may be exchanged in the described embodiments, preferably by also exchanging the N and P conductivity types of the semiconductors, for example, by exchanging the channel types of the field-effect transistors and the directions of the possible diodes.

Device 130 comprises a first switch 150. Switch 150 couples input/output terminal 110 to node 140. More particularly, switch 150 has a conduction terminal 152 coupled, preferably connected, to node 140, and a conduction terminal 154 coupled, preferably connected, to input/output terminal 110. Switch 150 has a control terminal 156 coupled to elements, not shown, of electronic circuit 100. An example of switch 150 is described hereafter in relation with FIG. 3.

In operation, first switch 150 has the function, when it is set to the conductive state, of applying to input/output terminal 110 a signal originating from the portion 120 of circuit 100 and/or of applying to portion 120 a signal applied to input/output terminal no by a device external to electronic circuit 100. When it is in the off state, switch 150 isolates input/output terminal no and node 140 from each other.

Preferably, first switch 150 is set to the on state for at least part of a phase of testing of electronic circuit 100, and in particular of testing of portion 120. For this purpose, a test device external to circuit 100 is used. The test device applies signals to input/output terminal no and/or receives signals applied by switch 150 to input/output terminal no. It is then determined, from the signals originating from input/output terminal no, whether the operation of portion 120 corresponds to an expected operation. Any usual method of testing a portion of an electronic circuit such as portion 120 may be implemented. The test is for example performed in factory. Circuit 100 then typically is a circuit randomly selected from among simultaneously-manufactured circuits, which are identical (to within manufacturing tolerances). Preferably, switch 150 is left in the off state outside of the test phase.

Device 130 further comprises a second switch 160. Switch 160 couples nodes 140 and GND together. More particularly, a conduction terminal 162 of switch 160 is coupled, preferably connected, to the node 140 of application of a signal sent to and/or originating from the portion 120 of circuit 100. Another conduction terminal 164 of switch 160 is coupled, preferably connected, to node GND. Preferably, switch 160 comprises or is formed by an N-channel field effect transistor. Terminal 162 then is a drain terminal of the transistor, and terminal 164 then is a source terminal of the transistor.

Device 130 further comprises a high-pass filter 170 (HPF) having an input 172 coupled, preferably by a diode 195, to input/output terminal 110 and an output 174 coupled to the control terminal of second switch 160. The anode of diode 195 preferably faces terminal 110. In a variation, diode 195 is omitted, the input of high-pass filter 170 being for example connected to input/output terminal 110.

Preferably, high-pass filter 170 is referenced with respect to a potential applied to a node 176. The potential of node 176 is a potential for turning second switch 160 to the off state. In other words, the application of the potential of node 176 to the control terminal of switch 160 causes the setting of switch 160 to the off state (non-conductive state). For this purpose, preferably, node 176 is connected to node GND.

High-pass filter 170 is provided so that, when the potential applied to input 172 is constant with respect to the potential of node 176, high-pass filter 170 applies the potential of node 176 to the control terminal of second switch 160. An example of high-pass filter 170 is described hereafter in relation with FIG. 2.

An overvoltage may occur between input/output terminal 110 and node GND. The voltage between input/output terminal 110 and node GND then tends to come out of the normal operating range defined hereabove.

An embodiment concerns an overvoltage originating from an electrostatic discharge when the circuit is not operating. Preferably, the concerned overvoltage is positive, in other words, the voltage between terminals 110 and GND tends to rise above an upper limit of the normal operating range of this voltage. In this case, more preferably, second switch 160 comprises, or is formed by an N-channel field-effect transistor.

The electrostatic discharge typically originates from a handling by a person when electronic circuit 100 is not connected, for example, when circuit 100 is packed or unpacked before the installation and the connection of circuit 100 in an electronic device. In an example of this embodiment, the electrostatic discharge is modeled according to a usual model of electrostatic discharge from the human body. The human body model may comprise a charged capacitive element and a discharge resistor. As an example, the electrostatic discharge has a modeled duration in the range from 1 μs to 5 μs.

The electrostatic discharge is received by high-pass filter 170, preferably after having crossed diode 195. According to an example, it is provided for high-pass filter 170 to have a cutoff time, defined by the inverse of a −3 dB cutoff frequency, greater than the modeled duration. The cutoff time is then greater than 1 μs, preferably greater than 2 μs. As a result, after the reception of the discharge by high-pass filter 170, switch 160 is set to the on state for at least the duration of the electrostatic discharge. This example is not limiting, and high-pass filter 170 may have any cutoff frequency capable of setting the second switch to the on state for at least the modeled duration. Based on the above example, it will be within the abilities of those skilled in the art to determine such a cutoff frequency, according to the type of the selected filter and to the electrostatic discharge model, for example, by implementing a model of this type of filter and the discharge model for various cutoff frequency values.

As a result, even if switch 150 is in the on state and the electrostatic discharge reaches node 140, the discharge is carried off to node GND. Thereby, it is avoided for the electrostatic discharge to cause a deterioration of transistor 122 such as a gate insulator breakdown. In the shown example, in the absence of a carrying off of the discharge, the breakdown would risk being caused by a gate-source voltage higher than a breakdown voltage of the gate insulator of transistor 122. Thus, due to the fact that the discharges are carried off, device 130 protects portion 120 against electrostatic discharges arriving into circuit 100 through input/output terminal 110.

According to the embodiments where electronic circuit 100 comprises diode 195, electronic circuit 100 further comprises, preferably, an input/output terminal 190. Diode 195 couples input/output terminals 110 and 190 to each other. The cathode of the diode preferably faces input/output terminal 190. The input 172 of high-pass filter 170 is coupled, preferably connected, to input/output terminal 190.

Input/output terminal 190 may be a supply terminal of the portion 120 of circuit 100. In operation, in the absence of an overvoltage, the power supply voltage (that is, the potential difference between terminal 190 and node GND) is used by transistor 120. The power supply voltage is preferably substantially constant, so that the high-pass filter does not cause the setting to the on state of switch 160. Indeed, such a setting to the on state would risk disturbing the operation of circuit 100.

In operation, input/output terminal 110 is preferably left floating (in other words, only used during the test phase) or is held at a potential lower than that of input/output terminal 190. Diode 195 is then non-conductive.

In test phase, input/output terminal 190 is preferably held at a potential greater than that of input/output terminal 110. As a result, diode 195 remains in the non-conductive state during the test. This enables to apply and/or to receive, on input/output terminal 110, signals having a frequency and/or an amplitude sufficient for there to be, in the absence of non-conductive diode 195, a risk for the high-pass filter to turn switch 160 on after the reception of the signals. Indeed, such a setting to the on state would risk disturbing the testing of circuit 100.

Examples of an embodiment concerning positive electrostatic discharges have been described hereabove. Another embodiment concerning negative electrostatic discharges differs from the above embodiment in that the second switch 160 is preferably a P-channel field-effect transistor. Further, the describe embodiments are not limited to the cases of overvoltages originating from electrostatic discharges from a person. Thus, although the above-described modeled duration is provided by a model of an electrostatic discharge originating from the human body, any overvoltage model may be used to define the modeled duration. High-pass filter 170 then receives the overvoltage, which causes the setting to the high state of switch 160. The cutoff frequency selected for high-pass filter 170 is then capable of setting the second switch to the on state for at least the modeled duration, which enables to protect circuit 100 against the overvoltage.

Figure 2:
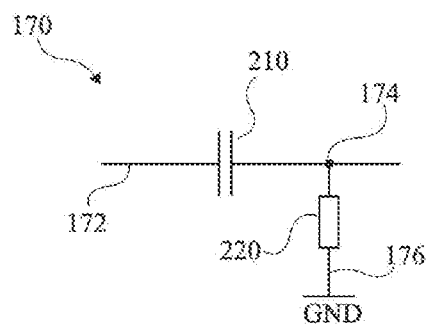
FIG. 2 schematically shows an example of a high-pass filter of the electronic circuit of FIG. 1.

FIG. 2 schematically shows an example of the high-pass filter 170 of the electronic circuit 100 of FIG. 1.

According to this example, high-pass filter 170 is of resistor-capacitor type RC, that is, high-pass filter 170 comprises a capacitive element 210, preferably a capacitor, coupling input 172 to the output 174 of high-pass filter 170, and a resistor 220 coupling the output 174 of high-pass filter 170, and a resistor 220 coupling the output 174 of high-pass filter 170 to node 176. The shown example is not limiting and high-pass filter 170 may be of any type.

Preferably, as in the shown example, high-pass filter 170 is passive, that is, the power supplied by high-pass filter 170 to control switch 160 is formed by all or part of the power received by passive high-pass filter 170 on its input 172. In other words, high-pass filter 170 receives, outside of input 172 and of node 176, power from no other node. In particular, high-pass filter 170 does not receive power from a power supply node. Preferably, part of the power received on input 172 is dissipated in high-pass filter 170, here in resistor 220. High-pass filter 170 may be of any passive type. However, the shown example has the advantage of being simpler than other types of passive filters.

In the absence of a connection of electronic circuit 100 to a power supply, typically in the cases described hereabove of handling of circuit 100 by a person, the control terminal of switch 150 may be floating. When an overvoltage occurs, the on/off state of switch 150 is not fixed, and switch 150 might for example be on. Due to the fact that high-pass filter 170 is passive, high-pass filter 170 sets second switch 160 to the on state during the discharge, including in the absence of a power supply voltage. Thus, the fact of providing for high-pass filter 170 to be passive enables to protect circuit 100 against overvoltages even when circuit 100 is not powered.

Figure 3:
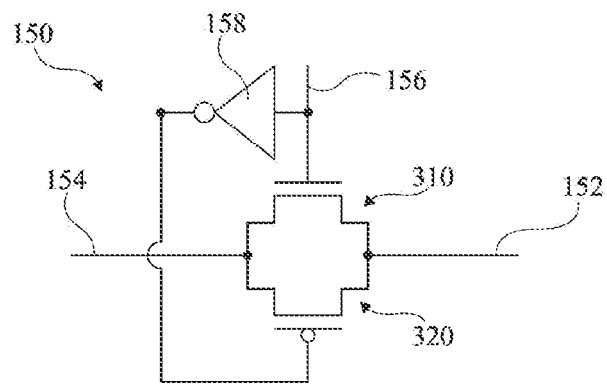
FIG. 3 schematically shows an example of a switch of the electronic circuit of FIG. 1.

FIG. 3 schematically shows an example of the first switch 150 of the electronic circuit 100 of FIG. 1.

According to this example, first switch 150 is a two-way pass gate. Preferably, first switch 150 then comprises an N-channel field effect transistor 310 and a P-channel field-effect transistor 320 electrically in parallel between the conduction terminals 152 and 154 of switch 150. The source of each of transistors 310 and 320 is coupled, preferably connected, to the drain of the other one of transistors 310 and 320. The gates of transistors 310 and 312 are coupled to each other by an inverter 158. The input of inverter 158 forms the control terminal 156 of switch 150. As an example, the control terminals of transistors 310 and 320 are coupled, preferably connected, respectively to the input and the output of inverter 158. This example is not limiting, and switch 150 may be any switch, preferably capable of being included in integrated circuit 100, more preferably forming a two-way pass gate.

When switch 150 is in the on state and in particular during the test phase, the signals originating from input/output terminal 110 and applied to node 140 by two-way pass gate 150 may be analog. The signals applied by the portion 120 of circuit 100 to node 140 and, by pass gate 150, to input/output terminal 110, may also be analog. In other words, node 140 then is a node of application of an analog signal. Analog signal means a signal conveying information varying continuously when a value of the signal, such as a voltage, varies continuously.

For this purpose, as an example, the portion 120 of circuit 100 comprises one or a plurality of analog circuits coupled, preferably connected, to node 140. In other words, transistor 122 is, in this example, located in an analog circuit. Call analog circuit a circuit configured to receive, use, or deliver an analog signal. As an example, the analog circuit is a portion of a digital-to-analog or analog-to-digital converter, or also, for example, all or part of a regulated voltage supply circuit.

Thus, when pass gate 150 is conductive, in particular during the test phase, the analog signal sent to or originating from portion 120 is applied to input/output terminal 110 by an external device or by pass gate 150.

Figure 4:
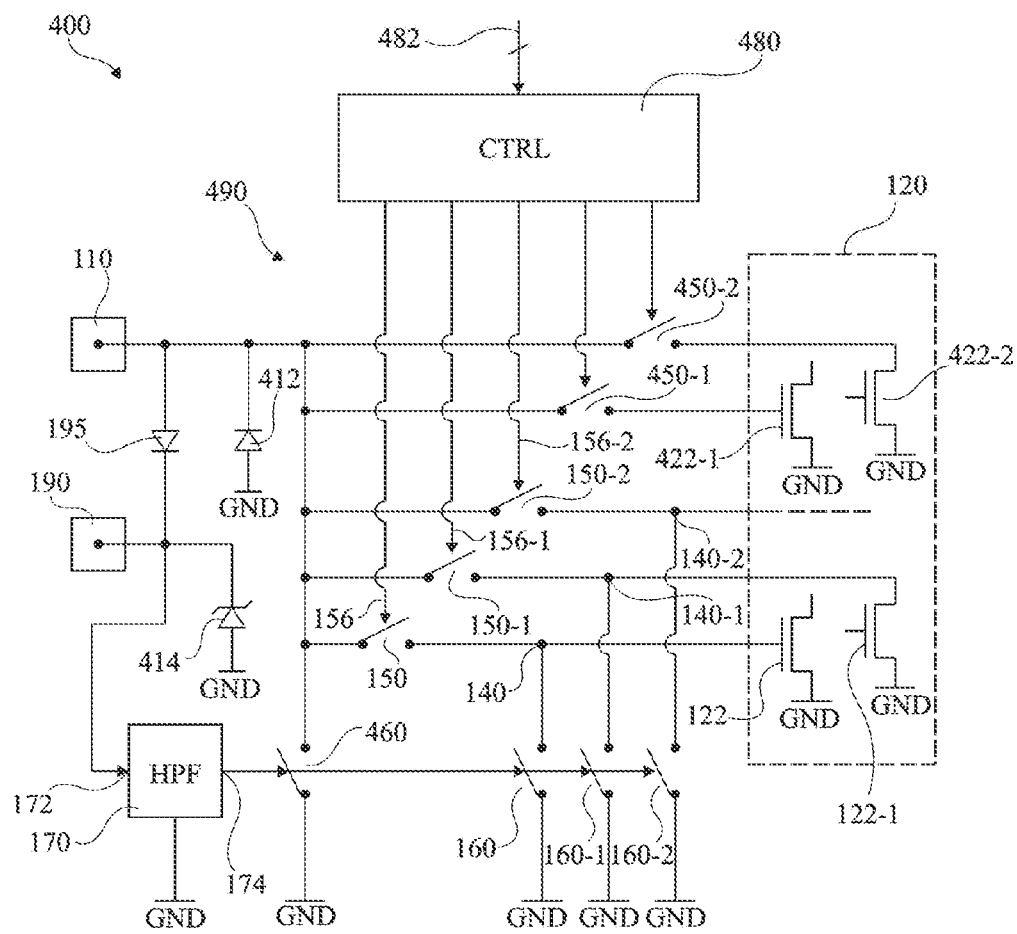
FIG. 4 schematically shows another embodiment of an electronic circuit.

FIG. 4 schematically shows another embodiment of an electronic circuit 400. Circuit 400 comprises elements identical or similar to those of the electronic circuit 100 of FIG. 1, arranged identically or similarly. These elements are not described again in detail. Only the differences between circuit 400 and the circuit 100 of FIG. 1 are highlighted. Similarly, circuit 400 implements operating and test steps identical or similar to those of the circuit 100 of FIG. 1. These steps are not described in detail again either. Only the differences between the methods implemented by circuit 400 and the circuit 100 of FIG. 1 are highlighted.

According to an embodiment, electronic circuit 400 comprises, in addition to node 140, one or a plurality of nodes 140-$i$ (140-1, 140-2), i being an index varying from 1 to the number of nodes 140-$i$. Each of nodes 140-$i$ is coupled, preferably connected, to the portion 120 of circuit 400.

The portion 120 of circuit 400 then comprises, in addition to transistor 122, one or a plurality of transistors 122-$j$ (122-1) coupled, preferably connected, to nodes 140-$i$, $j$ being an index varying between 1 and the number of transistors 122-$j$ coupled or connected to node 140-$i$. In the shown example, transistor 122-1 has a source terminal coupled, preferably connected, to node GND, a drain terminal coupled, preferably connected, to node 140-1, and a control terminal coupled, preferably connected, to elements, not shown, of portion 120.

Electronic circuit 400 also comprises, in addition to switch 150, one or a plurality of switches 150-$i$ coupling the respective nodes 140-$i$ to input/output terminal 110. In other words, for each of nodes 140-$i$, switch 150-$i$ has a conduction terminal coupled, preferably connected, to node 140-$i$, and another conduction terminal coupled, preferably connected, to input/output terminal 110. Preferably, each of switches 150-$i$ comprises, or is formed by, a two-way pass gate such as that of FIG. 3.

Preferably, electronic circuit 400 comprises, in addition to switch 160, one or a plurality of switches 160-$i$ coupling the respective nodes 140-$i$ to node GND. In other words, for each of nodes 140-$i$, switch 160-$i$ has a conduction terminal coupled, preferably connected, to node 140-$i$, and another conduction terminal coupled, preferably connected, to node GND. Preferably, switches 160-$i$ are all controlled by high-pass filter 170. As a variation, a plurality of high-pass filters having their inputs coupled, or connected, to input/output terminal 110, and each having an output controlling one or a plurality of switches 160-$i$, may be provided.

In case of a positive overvoltage between input/output terminal 110 and node GND, the operation of switches 150-$i$ and 160-$i$ is the same as that, described in relation with FIG. 1, of respective switches 150 and 160. As a result, in addition to transistor 122, transistors 122-$j$ are also protected against overvoltages. In the shown example, transistor 122-1 is protected against a breakdown of the gate insulator caused by a voltage greater than a breakdown voltage between the drain and the gate of transistor 122-1.

According to an embodiment, circuit 400 further comprises a switch 460 coupling input/output terminal 110 to node GND. The output 174 of high-pass filter 170 is then coupled to a control terminal of switch 460. In case of an overvoltage between input/output terminal 110 and node GND, this overvoltage is at least partly discharged before reaching switches 150, 150-$i$. This results in an improvement of the protection with respect to embodiments where switch 460 is not provided. Further, this may enable to protect switches 150, 150-$i$ against the overvoltage, or to improve the protection of the switches.

According to an embodiment, circuit 400 comprises a diode 412 coupling input/output terminal 110 to node GND. In the case where the normal operating range of the voltage between input/output terminal 110 and node GND is entirely positive, diode 412 has its cathode facing input/output terminal 110. Thus, if a negative overvoltage occurs, that is, an overvoltage during which the voltage between input/output terminal 110 and node GND tends to become negative (potential of terminal 110 smaller than that of node GND), this overvoltage is discharged. This thus enables to protect the transistors 122, 122-$j$ of the portion 120 of circuit 400 against negative overvoltages.

According to an embodiment, circuit 400 further comprises a control circuit 480 (CTRL) coupled, preferably connected, to the control terminal 156 of switch 150. Control circuit 480 may further be coupled, preferably connected, to the control terminals 156-$i$ (156-1, 156-2) of the respective switches 150-$i$. Preferably, control circuit 480 receives a digital signal 482. Digital signal 482 is, more preferably, formed of a plurality of bits. Control circuit 480 is configured to control the on/off state of switches 150, 150-$i$ according to digital signal 482. In other words, control circuit 480 is configured so that switches 150, 150-$i$ form, with control circuit 480, branches of a multiplexer 490.

Preferably, electronic circuit 400 is configured so that multiplexer 490 connects switches 150, 150-$i$ to input/output terminal no, one by one and/or in successive groups. In particular, during the test phase, the operation of a plurality of transistors and/or elements and/or circuits of portion 120 may be tested with the signal input/output terminal 110 to apply/receive test signals. Such a test method is not described in detail, the described embodiments being compatible with usual methods of testing portions of an electronic circuit.

According to an embodiment, the portion 120 of circuit 400 comprises, in addition to transistor 122 and the possible transistors 122-$j$, transistors 422-$k1$, k1 being an index varying between 1 and the number of transistors 422-$k1$.

Preferably, transistor 122 and transistors 122-$j$ have a same relatively small gate thickness, for example, smaller than 2 nm, for example, equal to 1.7 nm. Transistor(s) 422-$k1$ then typically have a same relatively large gate thickness, for example, greater than 3 nm, for example, equal to 5 nm. In other words, transistor(s) 422-$k1$ have a gate thickness greater than that of transistor(s) 122, 122-$j$. In this case, preferably, the normal operating range, such as defined hereabove, of the voltage between the gate and the source or of the voltage between the drain and the gate, is wider for transistor(s) 422-$k1$ than for transistor(s) 122, 122-$j$. As an example, this range extends from 0 to approximately 4 V for transistor(s) 422-$k1$, and from 0 to approximately 1.7 V for transistor(s) 122, 122-$j$. More preferably, a voltage greater than a threshold of deterioration of transistors 122, 122-$j$, for example, the breakdown voltage of the transistors, is located in the normal operating range of transistors 422-$k1$.

Input/output terminal 190 may be a terminal of application of a power supply voltage of a circuit of the portion 120 comprising transistors 422-$k1$. Input/output terminal 190 may also be an input or an output of a signal originating from and/or sent to transistors 422-$k1$. Portion 120, comprising transistors 122, 122-$j$, and 422-$k1$ having different normal operating voltage ranges, is not described in detail herein, the described embodiments being compatible with such usual portions of electronic circuits.

In operation, in the absence of an overvoltage, the voltage applied to input/output terminal 190 is used by transistors 422-$k1$. For example, the voltage applied to input/output terminal 190 is a voltage greater than the threshold of deterioration of transistors 122, 122-$j$. In the shown example, input/output terminal 190 is coupled by a Zener diode 414 to node GND. Zener diode 414 has its cathode facing input/output terminal 190 in the preferred case where, in the absence of an overvoltage, the voltage between input/output terminal 190 and node GND is positive (potential of input/output terminal 190 greater than that of node GND). The reverse threshold voltage of Zener diode 414 is provided to discharge an overvoltage towards node GND to protect transistors 422-$k1$ against an overvoltage. Zener diode 414 thus forms an overvoltage protection circuit. Zener diode 414 may be replaced with any component having the function of a Zener diode, that is, conducting the current when the voltage thereacross rises above a predefined threshold. More generally, the Zener diode may be replaced with any overvoltage protection circuit. According to an advantage of a protection circuit such as Zener diode 414, switches 150 may be selected so that the protection circuit protects switches 150 against the overvoltage, including in the case where switch 460 is omitted. The protection circuit may also, as a variation, be omitted.

Preferably, electronic circuit 400 further comprises one or a plurality of switches 450-$k2$ (450-1, 450-2), k2 being an index varying from 1 to the number of switches 450-$k2$. Switches 450-$k2$ couple transistors 422-$k1$ to input/output terminal 110. More particularly, each switch 450-$k2$ has a conduction terminal coupled, preferably connected, to input/output terminal 110, and another conduction terminal coupled, preferably connected, to one or a plurality of transistors 422-$k1$. In the shown example, switch 450-1 is coupled, preferably connected, to a gate terminal of transistor 422-1. In this example, switch 450-2 is coupled, preferably connected, to a drain terminal of transistor 422-2. Each of transistors 422-$k1$ may have a source terminal coupled or connected to node GND.

Preferably, control circuit 480 is coupled, preferably connected, to one or a plurality of the respective control terminals of switch(es) 450-$k2$. More preferably, control circuit 489 is configured so that switch(es) 150, 150-$i$ and switch(es) 450-$k2$ form branches of multiplexer 490. Based on the same input/output terminal 110, both the functionalities of portion 120 implemented by transistors 122, 122-$j$ and by transistors 422-$k1$ can then be tested.

It could have been devised to discharge an overvoltage between input/output terminal 110 and node GND when this overvoltage exceeds a given threshold such as a threshold voltage of a reverse-biased Zener diode. However, due to the fact that the voltage applied in normal operation to transistors 422-$k1$ is greater than the threshold of deterioration of transistors 122, 122-$j$, it would have been difficult to select the threshold voltage of the Zener diode to both: protect transistors 122, 122-$j$; and be able to apply to input/output terminal 190 a sufficiently high voltage to test the operation of transistors 422-$k1$ without discharging this voltage to node GND through the Zener diode.

As a comparison, the fact of providing to discharge the overvoltage by the setting to the on state of switch(es) 160, 160-$i$, and of the possible switch 460, through the high-pass filter 170 receiving the overvoltage, enables to test the functionalities of portion 120 implemented by all transistors 122, 122-*j*, and 422-*k*1 by using the single input/output terminal 110, and enables to protect transistors 122, 122-*j*.

In case of an overvoltage between input/output terminal 110 and node GND, the operation is the same as that described hereabove. In case of an overvoltage between input/output terminal 190 and node GND, high-pass filter 170 turns on switches 160, 160-*i*, and possibly switch 460 during the overvoltage.

A protection of transistors 122, 122-*j* against overvoltages reaching input/output terminal 110 and against overvoltages reaching input/output terminal 190 is thus obtained.

Various embodiments and variants have been described. Those skilled in the art will understand that certain features of these embodiments can be combined and other variants will readily occur to those skilled in the art.

Finally, the practical implementation of the described embodiments and variants is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic circuit comprising:
   a plurality of first switches, each first switch configured to couple a respective first node of the electronic circuit to a first input/output terminal of the electronic circuit;
   a plurality of second switches, each second switch configured to couple the respective first node to a second node of application of a fixed voltage potential;
   a high-pass filter having an input coupled to the first input/output terminal, and having an output coupled to a respective control terminal of each second switch; and
   a second input/output terminal coupled to the input of the high-pass filter, and coupled to the second node by a circuit of protection against electrostatic discharges.

2. The electronic circuit according to claim 1, wherein the input of the high-pass filter is coupled to the first input/output terminal by a diode, the diode having its anode facing the first input/output terminal.

3. The electronic circuit according to claim 1, wherein the high-pass filter has a cutoff frequency configured to set each second switch to an on-state for at least one time period modeled according to an overvoltage model, the time period being an electrostatic discharge period modeled according to a human body model.

4. The electronic circuit according to claim 1, further comprising a control circuit coupled to respective control terminals of the first switches, and configured so that the first switches together form branches of a multiplexer.

5. The electronic circuit according to claim 4, wherein the control circuit is configured to:
   receive a digital signal having a plurality of bits; and
   control an on/off state of each first switch based on the plurality of bits.

6. The electronic circuit according to claim 1, further comprising an additional switch configured to couple the second node to the first input/output terminal, wherein the output of the high-pass filter is coupled to a control terminal of the additional switch.

7. The electronic circuit according to claim 1, further comprising a diode coupling the second node to the first input/output terminal, and having its cathode facing the first input/output terminal.

8. The electronic circuit according to claim 1, comprising:
   a first transistor having a first conduction terminal coupled to the second node, and a first control terminal or a second conduction terminal coupled to one of the first nodes; and
   a second transistor having a third conduction terminal coupled to the second node, and a second control terminal or a fourth conduction terminal coupled to another of the first nodes, wherein the second transistor has a second gate thickness greater than a first gate thickness of the first transistor.

9. The electronic circuit according to claim 1, wherein each first node is a node of application of an analog signal.

10. The electronic circuit according to claim 1, wherein the high-pass filter is passive.

11. A method of protecting an electronic circuit against an overvoltage, the electronic circuit comprising a plurality of first switches, each first switch configured to couple a respective first node of the electronic circuit to a first input/output terminal of the electronic circuit, a plurality of second switches, each second switch configured to couple the respective first node to a second node of application of a fixed voltage potential, a high-pass filter having an input coupled to the first input/output terminal and an output coupled to a respective control terminal of each second switch, and a second input/output terminal coupled to the input of the high-pass filter, and coupled to the second node by a circuit of protection against electrostatic discharges, the method comprising:
   receiving the overvoltage by the high-pass filter;
   setting, by the high-pass filter, each second switch to an on-state based on the receiving the overvoltage; and
   providing a Zener diode function by the circuit of protection against electrostatic discharges.

12. The method according to claim 11, further comprising an absence of a power supply voltage being applied to the electronic circuit during the receiving the overvoltage.

13. The method according to claim 11, further comprising operating the high-pass filter passively.

14. The method according to claim 11, further comprising setting, by the high-pass filter, each second switch to the on-state for at least one time period modeled according to an overvoltage model, the time period being an electrostatic discharge period modeled according to a human body model.

15. A method of testing an electronic circuit, the electronic circuit comprising a plurality of first switches, each first switch configured to couple a respective first node of the electronic circuit to a first input/output terminal of the electronic circuit, a plurality of second switches, each second switch configured to couple the respective first node to a second node of application of a fixed voltage potential, a high-pass filter having an input coupled to the first input/output terminal and an output coupled to a respective control terminal of each second switch, and a second input/output terminal coupled to the input of the high-pass filter, and coupled to the second node by a circuit of protection against electrostatic discharges, the method comprising:
   applying and/or receiving a signal to and/or from, respectively, the first input/output terminal; and
   providing a Zener diode function by the circuit of protection against electrostatic discharges.

16. The method according to claim 15, further comprising setting each first switch to an on-state during the testing to bypass the high-pass filter.

17. The method according to claim 15, further comprising holding the second input/output terminal at a first voltage potential greater than a second voltage potential of the first input/output terminal.

18. The method according to claim 17, wherein the applying and/or receiving comprises applying and/or receiving signals having a frequency and/or an amplitude that is sufficient for the high-pass filter to set each second switch to an on-state in an absence of the first voltage potential.

19. The method according to claim 15, wherein:
the electronic circuit further comprises a control circuit coupled to respective control terminals of the first switches, and configured so that the first switches together form branches of a multiplexer; and
the method further comprises:
receiving, by the control circuit, a digital signal having a plurality of bits; and
controlling, by the control circuit, an on/off state of each first switch based on the plurality of bits.

20. The method according to claim 19, further comprising connecting, by the control circuit, the first switches to the second input/output terminal, one by one and/or in successive groups.

\* \* \* \* \*